(12) United States Patent
Wang et al.

(10) Patent No.: US 11,894,389 B2
(45) Date of Patent: Feb. 6, 2024

(54) DISPLAY SUBSTRATE AND METHOD FOR PREPARING THE SAME, AND DISPLAY DEVICE (71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Wang, Beijing (CN); Zhifeng Zhan, Beijing (CN); Yanxin Wang, Beijing (CN); Shuquan Yang, Beijing (CN); Jiafan Shi, Beijing (CN); Peng Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 742 days.

(21) Appl. No.: 16/338,455

(22) PCT Filed: Oct. 24, 2018

(86) PCT No.: PCT/CN2018/111592
§ 371 (c)(1),
(2) Date: Mar. 29, 2019

(87) PCT Pub. No.: WO2019/184319
PCT Pub. Date: Oct. 3, 2019

(65) Prior Publication Data
US 2021/0375942 A1 Dec. 2, 2021

(30) Foreign Application Priority Data
Mar. 28, 2018 (CN) .......................... 201810265798.0

(51) Int. Cl.
*H01L 27/12* (2006.01)
(52) U.S. Cl.
CPC .......... *H01L 27/124* (2013.01); *H01L 27/127* (2013.01); *H01L 27/1222* (2013.01); *H01L 27/1288* (2013.01)
(58) Field of Classification Search
CPC ........... H01L 27/124; H01L 2251/5338; G02F 1/136286; H10K 59/131
See application file for complete search history.

(56) References Cited

U.S. PATENT DOCUMENTS

2014/0232956 A1* 8/2014 Kwon ................. H01L 27/3276
349/12
2016/0093644 A1 3/2016 Ki et al.
(Continued)

FOREIGN PATENT DOCUMENTS

CN 103926774 A 7/2014
CN 106229321 A 12/2016
(Continued)

OTHER PUBLICATIONS

First Chinese Office Action dated Mar. 16, 2020, received for corresponding Chinese Application No. 201810265798.0, 14 pages.
(Continued)

*Primary Examiner* — Peter M Albrecht
(74) *Attorney, Agent, or Firm* — Kinney & Lange, P.A.

(57) ABSTRACT

Provided is a display substrate, a method for preparing the same, and a display device. The display substrate includes a pad bending region. In the pad bending region, the display substrate includes a base, and an inorganic insulating layer and a metal layer laminated on the base. The metal layer includes a plurality of discrete metal wires. The inorganic insulating layer includes a plurality of discrete first inorganic
(Continued)

insulating layers, each of which is arranged between each of the plurality of discrete metal wires and the base.

20 Claims, 6 Drawing Sheets

(56) References Cited

U.S. PATENT DOCUMENTS

| | | | |
|---|---|---|---|
| 2016/0190522 A1 | 6/2016 | Lee et al. | |
| 2016/0307528 A1 | 10/2016 | Zou et al. | |
| 2017/0133408 A1 | 5/2017 | Leng et al. | |
| 2018/0033821 A1* | 2/2018 | Kim | H01L 27/124 |
| 2018/0337367 A1* | 11/2018 | Tomioka | H01L 51/5203 |

FOREIGN PATENT DOCUMENTS

| | | |
|---|---|---|
| CN | 106920829 A | 7/2017 |
| CN | 107112349 A | 8/2017 |
| CN | 107425044 A | 12/2017 |
| CN | 107818992 A | 3/2018 |
| CN | 108336099 A | 7/2018 |

OTHER PUBLICATIONS

International Search Report and Written Opinion for International Patent Application No. PCT/CN2018/111592, dated Jan. 30, 2019, 13 pages.

* cited by examiner

DISPLAY SUBSTRATE AND METHOD FOR PREPARING THE SAME, AND DISPLAY DEVICE

CROSS-REFERENCE TO RELATED APPLICATION

This application is the U.S. national phase of PCT Application No. PCT/CN2018/111592 filed on Oct. 24, 2018, which claims a priority to Chinese Patent Application No. 201810265798.0 filed on Mar. 28, 2018, the disclosures of which are incorporated in their entirety by reference herein.

TECHNICAL FIELD

The present disclosure relates to the field of display technology, e.g., to a display substrate, a method for preparing the same and a display device.

BACKGROUND

With the development of full-screen bezel-free technology, the bezel of the display panel becomes increasingly narrower. Pad bending technology is capable of bending the non-display portion of the display panel to the back of the display panel.

SUMMARY

In an aspect, a display substrate is provided, which includes a pad bending region;
  in the pad bending region, the display substrate includes a base, and an inorganic insulating layer and a metal layer laminated on the base;
  in which the metal layer includes a plurality of discrete metal wires, and the inorganic insulating layer includes a plurality of discrete first inorganic insulating layers, each of which is arranged between each of the plurality of discrete metal wires and the base.

In some embodiments, an orthogonal projection of each of the plurality of discrete metal wires on the base completely overlaps an orthogonal projection of the first inorganic insulating layer on the base.

In some embodiments, an orthogonal projection of the first inorganic insulating layer on the base covers an orthogonal projection of each of the plurality of discrete metal wires on the base, and an area of the orthogonal projection of the first inorganic insulating layer on the base is greater than an area of the orthogonal projection of each of the plurality of discrete metal wires on the base.

In some embodiments, the base is a flexible base.

In some embodiments, the base includes at least one material of: polyimide, polyethersulfone, polyacrylate, polyetherimide, polyethylene naphthalate, polyethylene terephthalate, polyphenylene sulfide, polyarylate, polycarbonate and cellulose acetate propionate.

In some embodiments, the inorganic insulating layer has a thickness of 500 Å to 2500 Å.

In some embodiments, the inorganic insulating layer includes at least one material of: silicon oxide, silicon nitride, and silicon oxynitride.

In another aspects, a method for preparing a display substrate is provided which includes:
  forming an inorganic insulating layer and a metal layer in sequence on a base of a pad bending region;
  forming the metal layer into a plurality of discrete metal wires through a patterning process using a first mask, in which the pad bending region includes a metal wire region where the plurality of discrete metal wires is located and an external region outside the metal wire region; and
  removing the inorganic insulating layer from the external region.

In some embodiments, the removing the inorganic insulating layer from the external region includes: removing the inorganic insulating layer from the external region through a patterning process using a second mask.

In some embodiments, the forming the metal layer into the plurality of discrete metal wires though the patterning process using the first mask includes etching the metal layer into the plurality of discrete metal wires through a first etching process using the first mask; and
  removing the inorganic insulating layer from the external region includes etching and removing the inorganic insulating layer from the external region through a second etching process.

In some embodiments, the forming the inorganic insulating layer and the metal layer in sequence on the base of the pad bending region includes:
  providing the base;
  forming a plurality of insulating layers on the base;
  patterning the plurality of insulating layers of the pad bending region, to form the inorganic insulating layer; and
  forming the metal layer.

In some embodiments, the forming the plurality of insulating layers on the base includes: forming a buffer layer, a first insulating layer, a second insulating layer, and an interlayer insulating layer in sequence on the base; and
  the patterning the plurality of insulating layers of the pad bending region, to form the inorganic insulating layer includes: etching and removing the interlayer insulating layer, the second insulating layer, and the first insulating layer in the pad bending region; and partially etching the buffer layer in the pad bending region to form the inorganic insulating layer.

In some embodiments, the buffer layer includes at least one material of: silicon oxide, silicon nitride, and silicon oxynitride.

In some embodiments, the base is a flexible base.

In some embodiments, the base includes at least one material of: polyimide, polyethersulfone, polyacrylate, polyetherimide, polyethylene naphthalate, polyethylene terephthalate, polyphenylene sulfide, polyarylate, polycarbonate and cellulose acetate propionate.

In another aspect, a display device is provided which includes the above display substrate.

DETAILED DESCRIPTION

Figure 1:
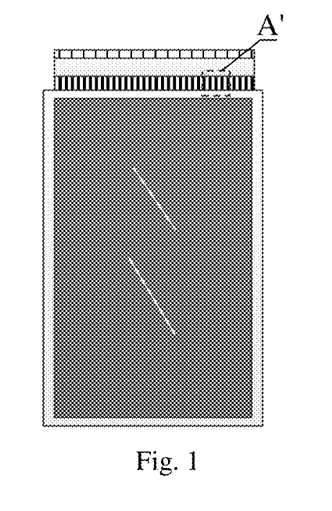
FIG. 1 is a schematic view of a display substrate.
Figure 2:
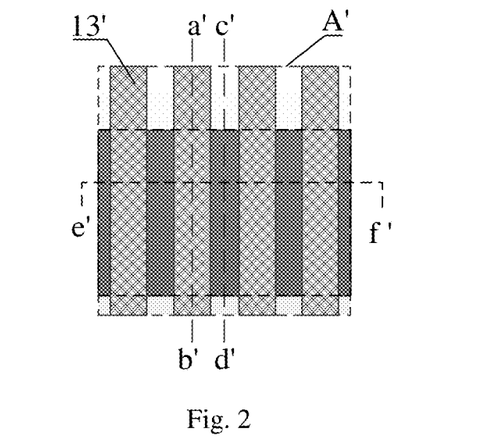
FIG. 2 is an enlarged view of A' portion in the display panel of FIG. 1.
Figure 3:
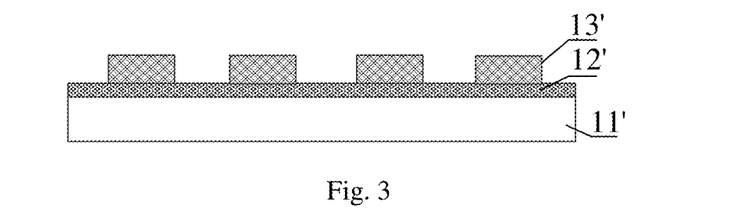
FIG. 3 is a sectional view of the display panel along line e'-f' of FIG. 2.
Figure 4A:
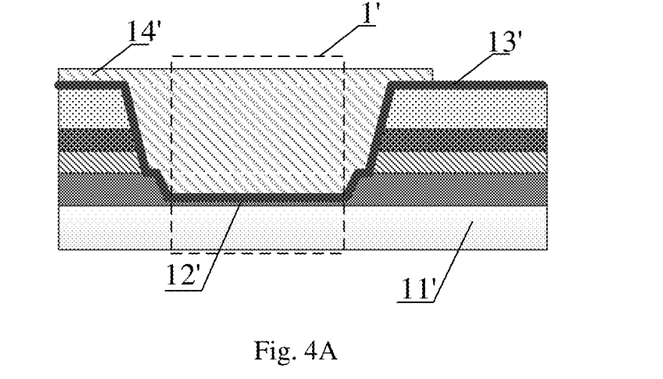
FIG. 4A is a sectional view of the display panel along line a'-b' of FIG. 2.
Figure 4B:
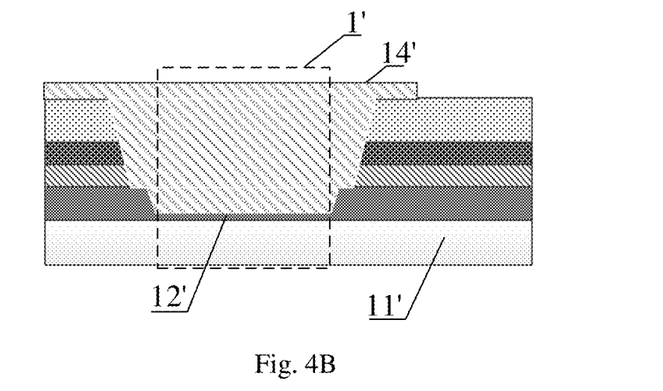
FIG. 4B is a sectional view of the display panel along line c'-d' of FIG. 2.
Figure 5:
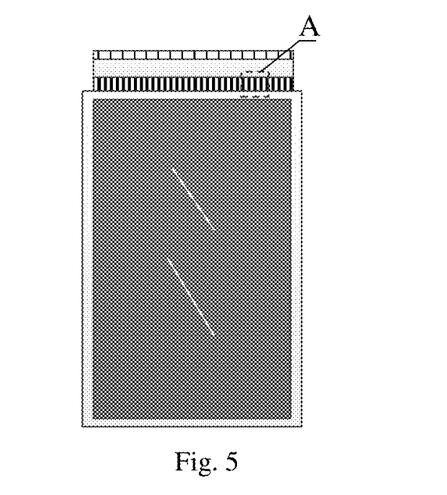
FIG. 5 is a schematic view of a display substrate according to some embodiments of the present disclosure.
Figure 6:
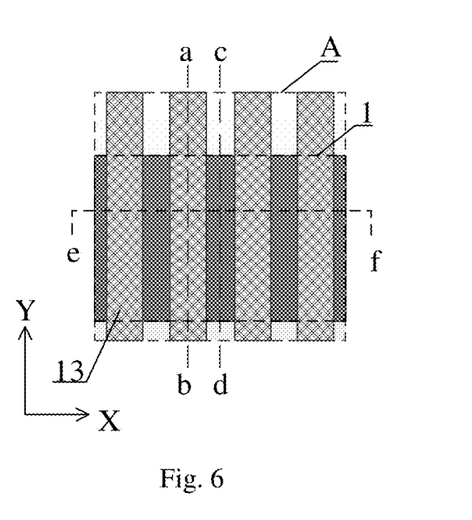
FIG. 6 is an enlarged view of A portion in the display panel of FIG. 5.

With the development of full-screen bezel-free technology, in order to reduce the width of the bezel of the display panel, as shown in FIG. 1, the bending region at the edge of the display panel is bent to the back of the display panel. FIG. 2 shows an enlarged view of A' portion of the bending region. As shown in FIG. 2, the portion A' includes a pad bending region 1', in which one side of the pad bending region 1' is connected to the display region of the display panel, while the other side is connected to the drive circuit portion that is bent to the back of the display panel. FIG. 3 is a sectional view of the display panel along line e'-f' of FIG. 2; FIG. 4A is a sectional view of the display panel along line a'-b' of FIG. 2; and FIG. 4B is a sectional view of the display panel along line c'-d' of FIG. 2. Referring to FIGS. 2, 3, 4A, and 4B, an insulating layer including a multilayer structure is formed on the base 11'; in the portion of the pad bending region 1', the insulating layer only remained a portion closest to the base 11' (i.e., the inorganic insulating layer 12'), that is, a recess is formed at the pad bending region 1'; and then, a metal wire 13' is formed on the insulating layer of the structure, and an organic insulating protective layer 14' is formed to cover the metal wire 13' and the like are formed. The pad bending region 1' includes a plurality of discrete metal wires 13'.

However, when the bending region of the display panel is bent, the inorganic insulating layer 12' is broken, leading to the breakage of the metal wires 10' above the inorganic insulating layer 12'. Since the inorganic insulating layer 12' is an integrated layer structure, the crack at the breakage of the inorganic insulating layer 12' propagates to the surrounding inorganic insulating layer beneath the other metal wires, leading to the breakage of the metal wires at the crack propagation and causing display failure.

Some embodiments of present disclosure provide a display substrate, which includes a pad bending region 1, as shown in FIGS. 5 to 8B. In the pad bending region, the display substrate includes a base 11, and an inorganic insulating layer and a metal layer laminated on the base 11. The metal layer includes a plurality of discrete metal wires 13, and the inorganic insulating layer includes a plurality of discrete first inorganic insulating layers 12, each of which is arranged between each of the plurality of discrete metal wires 13 and the base 11.

Figure 7A:
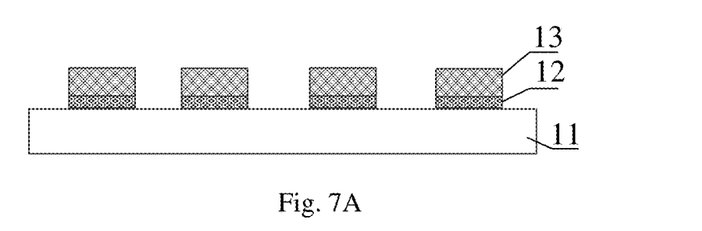
FIG. 7A is a schematic view of the display panel along line e-f of FIG. 6 according to some embodiments.

In some embodiments, referring to FIG. 7A, an orthogonal projection of each of the plurality of discrete metal wires 13 on the base 11 completely overlaps the orthogonal projection of the first inorganic insulating layer 12 (a first inorganic insulating layer 12 between each of the plurality of discrete metal wires 13 and the base 11) on the base 11.

Figure 7B:
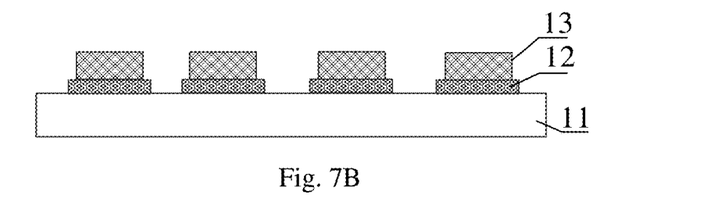
FIG. 7B is a schematic view of the display panel along line e-f of FIG. 6 according to some other embodiments.

In some embodiments, referring to FIG. 7B, the orthogonal projection of the first inorganic insulating layer 12 on the base 11 covers the orthogonal projection of the metal wires 13 (the metal wires 13 arranged on the side of the first inorganic insulating layer 12 away from the base 11) on the base 11, and the area of the orthogonal projection of the first inorganic insulating layer 12 on the base 11 is greater than the area of the orthogonal projection of the metal wiring 13 on the base 11.

The orthogonal projection of the metal wire 13 on the base 11 covers the orthogonal projection of the first inorganic insulating layer 12 on the base 11.

As for the display substrate of the embodiment shown in FIGS. 5 to 8B, in the pad bending region 1, the orthogonal projection of the discrete metal wires 13 on the base 11 covers the orthogonal projection of the first inorganic insulating layer 12 on the base 11. The pad bending region includes a metal wire region where the metal wires is located and an external region outside the metal wire region.

Referring to FIG. 7A, the metal wire 13 is provided with a first inorganic insulating layer 12 between the side proximate to the base 11 and the base 11, while the external region is not provided with an inorganic insulating layer. Since the breakage of the metal wires is caused by the breakage of the inorganic insulating layer underneath, in the embodiment of FIGS. 5 to 8B, the external region is not provided with the inorganic insulating layer, and the crack at the breakage of the metal wire 13 cannot propagate along the inorganic insulating layer to the inorganic insulating layer beneath the other metal wires, thereby preventing crack propagation from causing more breakage of the metal wires 13.

In some embodiments, the base 11 is a flexible base, so as to be bent in the pad bending region 1.

In some embodiments, the material of the base 11 includes at least one of: polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), and cellulose acetate propionate (CAP).

For example, the flexible base is composed of a first PI layer, a second PI layer, and an inorganic thin film layer arranged between the first PI layer and the second PI layer.

In some embodiments, in the above pad bending region 1, the inorganic insulating layer has a thickness of 500 Å to 2500 Å.

When the thickness of the inorganic insulating layer is 500 Å to 2500 Å, both the bending property and the insulating property of the inorganic insulating layer can be ensured.

In some embodiments, the inorganic insulating layer includes at least one material of: silicon nitride, silicon oxide, and silicon oxynitride.

Figure 8A:
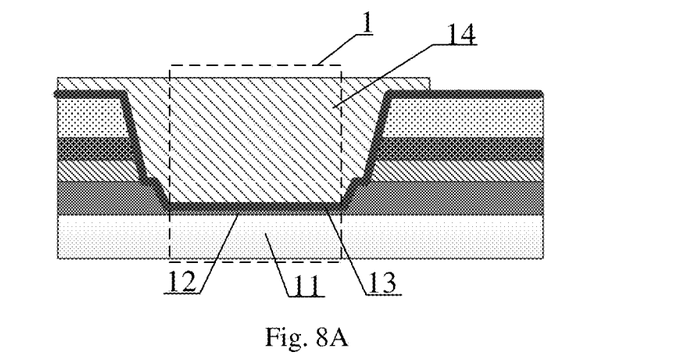
FIG. 8A is a sectional view of the display panel along line a-b of FIG. 6.
Figure 8B:
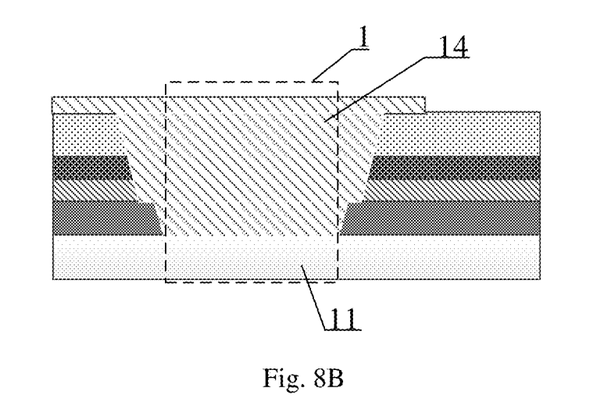
FIG. 8B is a sectional view of the display panel along line c-d of FIG. 6.

In some embodiments, another layer structure is provided on the side of the metal layer away from the base 11. Considering that the organic insulating material has strong bendability and is not easily broken, an organic insulating layer is provided on the side of the metal layer away from the base 11. As shown in FIG. 8A, an organic insulating layer 14 is further formed on one side of the metal wire 13 away from the base 11, to protect the metal wire 13.

In some embodiments, the organic insulating layer 14 includes at least one material of: polyimide, acryl, benzocyclobutene (BCB), and hexamethyldisiloxane.

Figure 9:
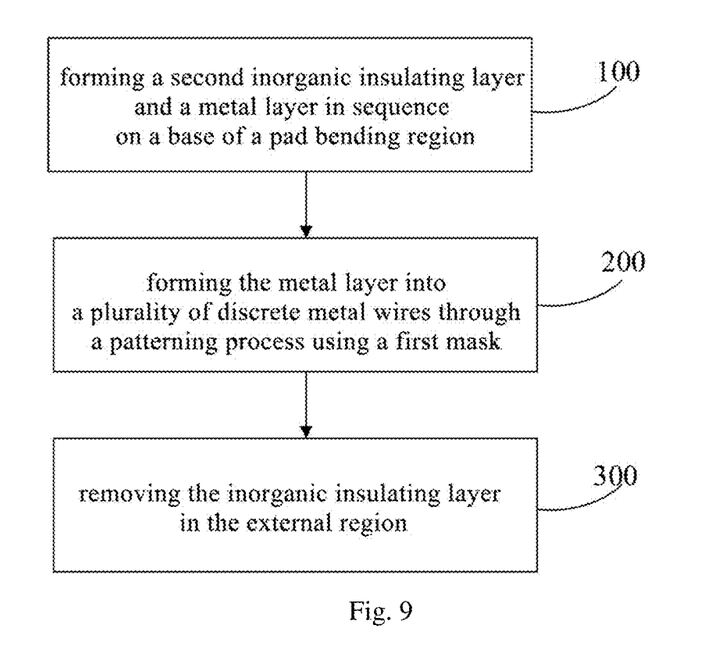
FIG. 9 is a flow chart of a method for preparing a display substrate according to some embodiments of the present disclosure.

Some embodiments provide a method of preparing a display substrate. Referring to FIG. 9, the method includes step 100, step 200, and step 300.

In step 100, a second inorganic insulating layer 121 and a metal layer are formed in sequence on the base 11 of the pad bending region, in which the pad bending region includes a metal wire region where the metal wires is located and an external region outside the metal wire region.

In step 200, the metal layer is formed into a plurality of discrete metal wires 13 through a patterning process using a first mask.

Figure 12A:
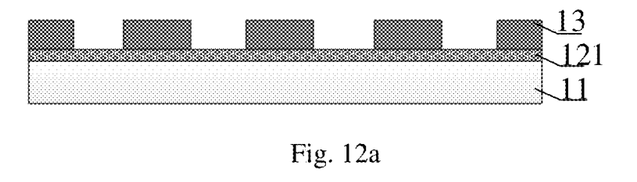
FIG. 12a is a schematic view of a display substrate formed according to step 100 and step 200.

The metal layer is etched to form a plurality of discrete metal wires 13. The schematic view of the pad bending region of the display substrate formed through the this step is shown in FIG. 12a, which is a sectional view of the pad bending region along the X direction of FIG. 6.

In some embodiments, the metal layer is etched by dry etching or wet etching.

In step 300, the second inorganic insulating layer in the external region is removed.

Figure 12B:
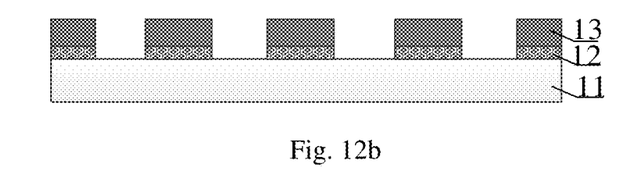
FIG. 12b is a schematic view of a display substrate formed according to step 100, step 200, and step 300.

The second inorganic insulating layer 121 of the external region is etched and removed to form a plurality of discrete first inorganic insulating layers 12. After step 100, step 200, and step 300, a sectional view of the pad bending region of the formed display substrate along the X direction is shown in FIG. 12b.

After the above steps, the second inorganic insulating layer in the external region is removed, and thus the path of crack propagation is blocked, thereby prevent the crack propagation from causing more breakage of the metal wires.

In some embodiments, the patterning process includes a photolithography process and an etching step. The photolithography process includes a process such as film forming, exposing and developing, and is a process for forming a pattern using a photoresist, a mask and an exposure machine. The etching step is a process for forming a predetermined pattern using an etching process such as a dry etching, a wet etching, printing, or inkjet.

In some embodiments, in the above step 300, the removing the second inorganic insulating layer in the external region includes: removing the second inorganic insulating layer in the external region through a patterning process using a second mask.

For example, the above process includes: coating a photoresist on the metal layer through a second mask, subjecting the pad bending region to a process such as exposing, developing and etching, and etching and removing the second inorganic insulation in the external region.

Figure 10:
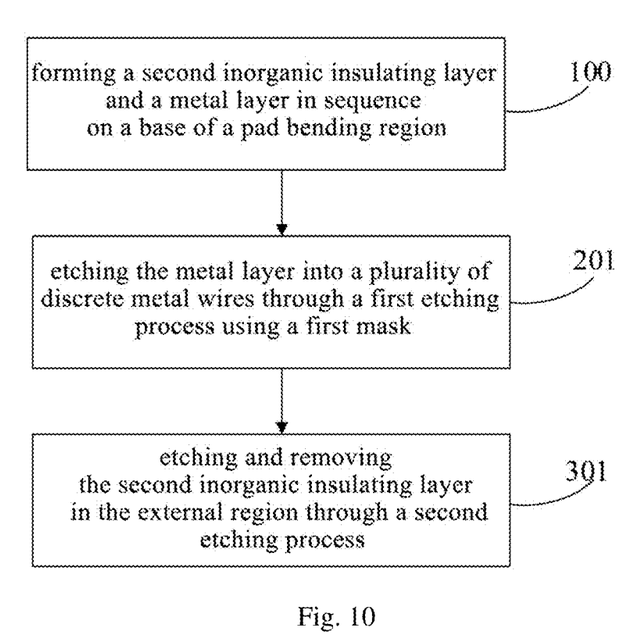
FIG. 10 is a flow chart of a method for preparing a display substrate according to some other embodiments of the present disclosure.

In some embodiments, referring to FIG. 10, the method for preparing the display substrate includes step 100, step 201, and step 301.

In step 100, a second inorganic insulating layer 121 and a metal layer are formed in sequence on a base 11 of a pad bending region.

In step 201, the metal layer is etched into a plurality of discrete metal wires 13 through a first etching process using a first mask.

In some embodiments, the first etching process is dry etching. For example, a metal layer is etched into a plurality of discrete metal wires through a dry etching process using chlorine gas.

In some embodiments, the first etching process is wet etching process.

Figure 12C:
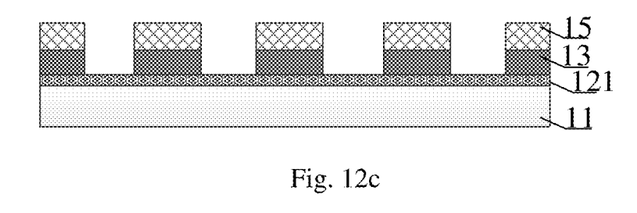
FIG. 12c is a schematic view of a display substrate formed according to step 100 and step 201.

In some embodiments, in addition to the steps 100 and 201, the method further includes a process such as coating photoresist, exposure and development. After these steps, the schematic view of the pad bending region of the formed display substrate is shown in FIG. 12c. A second inorganic insulating layer 121, a metal wire 13, and a photoresist layer 15 are formed in sequence on the base 11.

In step 301, the second inorganic insulating layer in the external region is etched and removed through a second etching process.

In step 301, the etching method is replaced (for example, the etching gas is replaced), and the structure formed in the above step 201 is subjected to the second etching, in which the second etching is performed by the second etching process. The second inorganic insulating layer in the external region is etched, to remove the second inorganic insulating layer in the external region.

In some embodiments, the second etching process is dry etching process.

For example, the second inorganic insulating layer is etched by a mixture of carbon tetrafluoride and oxygen in a certain ratio, to remove the second inorganic insulating layer in the external region.

After the etching is completed, the photoresist layer 15 coated in the above two steps is removed, to form the structure of FIG. 12b.

Figure 11:
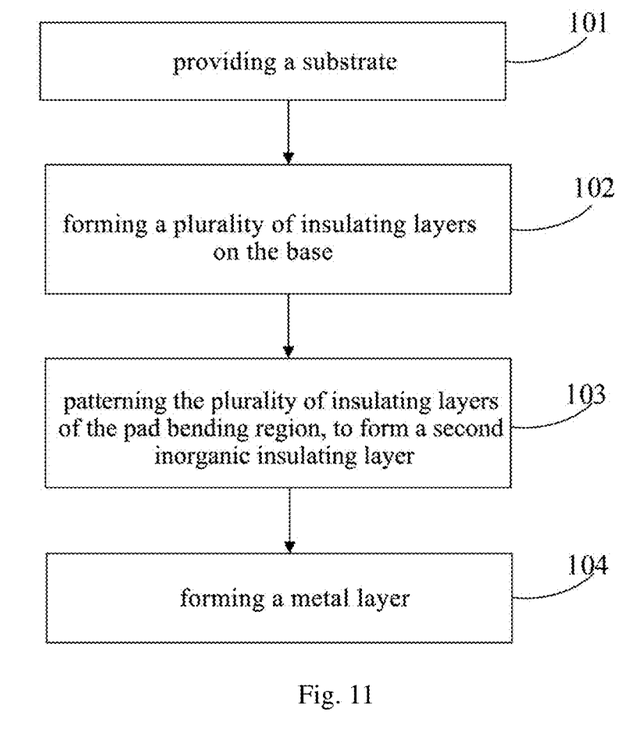
FIG. 11 is a flow chart of a method for forming an inorganic insulating layer and a metal layer in a pad bending region according to some embodiments of the present disclosure.

Referring to FIG. 11, step 100 in the above embodiments includes step 101, step 102, and step 103.

In step 101, a substrate 11 is provided.

In step 102, a plurality of insulating layers are formed on the base 11.

In some embodiments, step 102 includes forming a buffer layer 21, a first insulating layer 22, a second insulating layer 23, and an interlayer insulating layer 24 in sequence on the base 11.

In step 103, the plurality of insulating layers of the pad bending region is patterned, to form a second inorganic insulating layer.

Figure 12D:
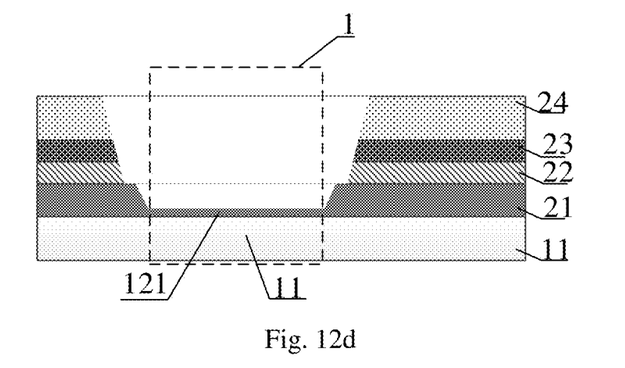
FIG. 12d is a schematic view of a display substrate formed according to step 101, step 102, and step 103.

In some embodiments, step 103 includes two etchings. During the patterning process of the plurality of insulating layers, the interlayer insulating layer, the second insulating layer and the first insulating layer in the bending region are etched and removed, and the buffer layer in the bending region is partially etched, to form the second inorganic insulating layer 121. After this step, a sectional view of the pad bending region of the formed display substrate along the Y direction c-d is shown in FIG. 12d. A buffer layer 21, a first insulating layer 22, a second insulating layer 23, and an interlayer insulating layer 24 are also remained outside the pad bending region.

In step 104, a metal layer is formed.

In some embodiments, the base is a flexible base, so as to be bent in the pad bending region.

In some embodiments, the material of the base includes at least one of: polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), and cellulose acetate propionate (CAP).

For example, the flexible base is composed of a first PI layer, a second PI layer, and an inorganic thin film layer arranged between the first PI layer and the second PI layer.

In some embodiments, the above buffer layer includes at least one material of: silicon oxide, silicon nitride, and silicon oxynitride.

In some embodiments, in the pad bending region 1, the first inorganic insulating layer has a thickness of 500 Å to 2500 Å.

When the thickness of the inorganic insulating layer is 500 Å to 2500 Å, both the bending property and the insulating property of the first inorganic insulating layer can be ensured.

In some embodiments, the second inorganic insulating layer and the first inorganic insulating layer include at least one material of: silicon nitride, silicon oxide, and silicon oxynitride.

Some embodiments provide a display device including the display substrate as described in any one of the above embodiments.

In some embodiments, the display device is a display panel.

In some embodiments, the display device may be a mobile phone, a tablet computer, a television, a display, a notebook computer, a digital photo frame, a navigator, electronic paper, or any product or component having a display function.

What is claimed is:

1. A display substrate, comprising a pad bending region;
   in the pad bending region, the display substrate comprising a base, and an inorganic insulating layer and a metal layer laminated on the base;
   wherein the metal layer comprises a plurality of discrete metal wires, and the inorganic insulating layer comprises a plurality of discrete first inorganic insulating layers, each of which is arranged between a respective one of the plurality of discrete metal wires and the base,
   wherein in a region outside the pad bending region, the inorganic insulating layer is also present between the plurality of discrete metal wires, and an organic insulating layer is provided on the metal wires and in direct contact with the metal wires, and wherein a cross-section of metal wires along an extending direction of the metal wires and passing through the metal wires is of concave shape with two end parts extending along the extending direction of the metal wires, and a first end part of the metal wires is covered by the organic insulating layer, and a second end part of the metal wires is partially covered by the organic insulating layer, and
   wherein the inorganic insulating layer is in physical contact with the metal wires and the base, and comprises a buffer layer, a first insulating layer, a second insulating layer and an interlayer insulating layer.

2. The display substrate of claim 1, wherein an orthogonal projection of each of the plurality of discrete metal wires on the base completely overlaps an orthogonal projection of a respective one of the plurality of discrete first inorganic insulating layers on the base.

3. The display substrate of claim 1, wherein an orthogonal projection of each of the plurality of discrete first inorganic insulating layers on the base covers an orthogonal projection of the respective one of the plurality of discrete metal wires on the base, and an area of the orthogonal projection of each of the plurality of discrete first inorganic insulating layers on the base is greater than an area of the orthogonal projection of the respective one of the plurality of discrete metal wires on the base.

4. The display substrate of claim 1, wherein the base is a flexible base.

5. The display substrate of claim 4, wherein a material of which the base is made comprises at least one selected from the group consisting of polyimide, polyethersulfone, polyacrylate, polyetherimide, polyethylene naphthalate, polyethylene terephthalate, polyphenylene sulfide, polyarylate, polycarbonate and cellulose acetate propionate.

6. The display substrate of claim 1, wherein the inorganic insulating layer has a thickness of 500 Å to 2500 Å.

7. The display substrate of claim 1, wherein a material of which the inorganic insulating layer is made comprises at least one selected from the group consisting of silicon oxide, silicon nitride, and silicon oxynitride.

8. A method for preparing a display substrate that comprises a pad bending region, a base in the pad bending region, and an inorganic insulating layer and a metal layer laminated on the base; wherein the metal layer comprises a plurality of discrete metal wires, and the inorganic insulating layer comprises a plurality of discrete first inorganic insulating layers, each of which is arranged between a respective one of the plurality of discrete metal wires and the base; wherein in a region outside the pad bending region, the inorganic insulating layer is also present between the plurality of discrete metal wires, and an organic insulating layer is provided on the metal wires and in direct contact with the metal wires; wherein a cross-section of metal wires along an extending direction of the metal wires and passing through the metal wires is of concave shape with two end parts extending along the extending direction of the metal wires, and a first end part of the metal wires is covered by the organic insulating layer, and a second end part of the metal wires is partially covered by the organic insulating layer; and wherein the inorganic insulating layer is in physical contact with the metal wires and the base, and comprises a buffer layer, a first insulating layer, a second insulating layer and an interlayer insulating layer,
   the method comprising:
   forming the inorganic insulating layer and the metal layer in sequence on the base of the pad bending region;
   forming the metal layer into the plurality of discrete metal wires through a patterning process using a first mask, wherein the pad bending region comprises a metal wire region where the plurality of discrete metal wires is located and an external region outside the metal wire region; and
   removing the inorganic insulating layer in the external region.

9. The method of claim 8, wherein the removing the inorganic insulating layer in the external region comprises:
   removing the inorganic insulating layer in the external region through a patterning process using a second mask.

10. The method of claim 8, wherein the forming the metal layer into the plurality of discrete metal wires through the patterning process using the first mask comprises etching the metal layer into the plurality of discrete metal wires through a first etching process using the first mask; and
   the removing the inorganic insulating layer in the external region comprises etching and removing the inorganic insulating layer in the external region through a second etching process.

11. The method of claim 8, wherein the forming the inorganic insulating layer and the metal layer in sequence on the base of the pad bending region comprises:

provamos the base;

forming a plurality of insulating layers on the base;

patterning the plurality of insulating layers of the pad bending region, to form the inorganic insulating layer; and forming the metal layer.

12. The method of claim 11, wherein the forming the plurality of insulating layers on the base comprises: forming the buffer layer, the first insulating layer, the second insulating layer, and the interlayer insulating layer in sequence on the base; and the patterning the plurality of insulating layers of the pad bending region to form the inorganic insulating layer comprises: etching and removing the interlayer insulating layer, the second insulating layer, and the first insulating layer in the pad bending region; and partially etching the buffer layer in the pad bending region to form the inorganic insulating layer.

13. The method of claim 12, wherein a material of which the buffer layer is made comprises at least one selected from the group consisting of silicon oxide, silicon nitride, and silicon oxynitride.

14. The method of claim 11, wherein the base is a flexible base.

15. The method of claim 14, wherein a material of which the base is made comprises at least one selected from the group consisting of polyimide, polyethersulfone, polyacrylate, polyetherimide, polyethylene naphthalate, polyethylene terephthalate, polyphenylene sulfide, polyarylate, polycarbonate and cellulose acetate propionate.

16. A display device comprising the display substrate of claim 1.

17. The display device of claim 16, wherein an orthogonal projection of each of the plurality of discrete metal wires on the base completely overlaps an orthogonal projection of a respective one of the plurality of discrete first inorganic insulating layers on the base.

18. The display device of claim 16, wherein an orthogonal projection of each of the plurality of discrete first inorganic insulating layers on the base covers an orthogonal projection of the respective one of the plurality of discrete metal wires on the base, and an area of the orthogonal projection of each of the plurality of discrete first inorganic insulating layers on the base is greater than an area of the orthogonal projection of the respective one of the plurality of discrete metal wires on the base.

19. The display device of claim 16, wherein the base is a flexible base.

20. The display device of claim 19, wherein a material of which the base is made comprises at least one selected from the group consisting of polyimide, polyethersulfone, polyacrylate, polytherimide, polyethylene naphthalate, polyethylene terephthalate, polyphenylene sulfide, polyarylate, polycarbonate and cellulose acetate propionate.

\* \* \* \* \*